(12) United States Patent
Kuo (10) Patent No.: US 10,802,090 B2
(45) Date of Patent: Oct. 13, 2020

(54) MAGNETIC BIOSENSOR AND METHOD OF DETECTING BIOSIGNAL

(71) Applicant: INDUSTRIAL TECHNOLOGY RESEARCH INSTITUTE, Hsinchu (TW)

(72) Inventor: Yi-Ching Kuo, Tainan (TW)

(73) Assignee: INDUSTRIAL TECHNOLOGY RESEARCH INSTITUTE, Hsinchu (TW)

( * ) Notice: Subject to any disclaimer, the term of this patent is extended or adjusted under 35 U.S.C. 154(b) by 67 days.

(21) Appl. No.: 16/229,571

(22) Filed: Dec. 21, 2018

(65) Prior Publication Data

US 2020/0200842 A1    Jun. 25, 2020

(51) Int. Cl.

| | |
|---|---|
| *G01R 33/12* | (2006.01) |
| *G01R 33/02* | (2006.01) |
| *G01N 29/02* | (2006.01) |
| *G01N 27/74* | (2006.01) |
| *G01R 33/09* | (2006.01) |

(52) U.S. Cl.
CPC ....... *G01R 33/1269* (2013.01); *G01N 27/745* (2013.01); *G01N 29/022* (2013.01); *G01R 33/0213* (2013.01); *G01R 33/091* (2013.01)

(58) Field of Classification Search
CPC ............ G01R 33/1269; G01R 33/0213; G01R 33/091; G01N 29/022; G01N 27/745
USPC ...................................................... 324/204
See application file for complete search history.

(56) References Cited

U.S. PATENT DOCUMENTS

| | | | |
|---|---|---|---|
| 5,902,489 | A | 5/1999 | Yasuda et al. |
| 6,055,097 | A | 4/2000 | Lanni et al. |
| 6,391,653 | B1 | 5/2002 | Letcher et al. |
| 6,881,314 | B1 | 4/2005 | Wang et al. |
| 6,948,843 | B2 | 9/2005 | Laugharn, Jr. et al. |
| 7,300,631 | B2 * | 11/2007 | Miller ............... B01L 3/502761 422/82.01 |
| 7,648,844 | B2 * | 1/2010 | Srivastava ........ G01N 33/54313 436/526 |
| 8,573,060 | B2 * | 11/2013 | Huang .................... C02F 1/505 73/570.5 |
| 2010/0289483 | A1 * | 11/2010 | Immink ............. G01R 33/1269 324/204 |

(Continued)

FOREIGN PATENT DOCUMENTS

| | | |
|---|---|---|
| CN | 102928596 B | 1/2015 |
| CN | 104968417 A | 10/2015 |
| CN | 107533056 A | 1/2018 |

OTHER PUBLICATIONS

Graham, D.L., Ferreira, H.A. and Freitas, P.P., 2004. Magnetoresistive-based biosensors and biochips. TRENDS in Biotechnology, 22(9), pp. 455-462. (Year: 2004).*

(Continued)

*Primary Examiner* — Christopher P McAndrew
(74) *Attorney, Agent, or Firm* — Locke Lord LLP; Tim Tingkang Xia, Esq.

(57) ABSTRACT

A magnetic biosensor includes a fluidic channel, a magnetic sensor and an acoustic wave emitter. The disposition of the magnetic sensor corresponds to the fluidic channel. The acoustic wave emitter includes two wave generating units, and the fluidic channel is disposed between the two wave generating units.

20 Claims, 7 Drawing Sheets

(56) References Cited

U.S. PATENT DOCUMENTS

| | | | |
|---|---|---|---|
| 2013/0156644 A1* | 6/2013 | Lee | G01N 29/222 422/69 |
| 2014/0017670 A1* | 1/2014 | Yu | B01L 3/502761 435/5 |
| 2015/0376692 A1* | 12/2015 | Esfandyarpour | C12Q 1/6874 506/2 |
| 2016/0193613 A1 | 7/2016 | Walti et al. | |
| 2017/0175073 A1 | 6/2017 | Lipkens et al. | |
| 2017/0248513 A1 | 8/2017 | Liu et al. | |

OTHER PUBLICATIONS

Wang, Z. and Zhe, J., 2011. Recent advances in particle and droplet manipulation for lab-on-a-chip devices based on surface acoustic waves. Lab on a Chip, 11(7), pp. 1280-1285. (Year: 2011).*

Athanasekos, Loukas, et al. "Micro-fabrication by laser radiation forces: A direct route to reversible free-standing three-dimensional structures." Optics Express 20.22 (2012): 24735-24740.

Fu, Yong Qing, et al. "Advances in piezoelectric thin films for acoustic biosensors, acoustofluidics and lab-on-chip applications." Progress in Materials Science 89 (2017): 31-91.

Kuznetsova, Larisa A., and W. Terence Coakley. "Applications of ultrasound streaming and radiation force in biosensors." Biosensors and Bioelectronics 22.8 (2007): 1567-1577.

Li, Peng, et al. "Acoustic separation of circulating tumor cells." Proceedings of the National Academy of Sciences 112.16 (2015): 4970-4975.

Shi, Jinjie, et al. "Acoustic tweezers: patterning cells and microparticles using standing surface acoustic waves (SSAW)." Lab on a Chip 9.20 (2009): 2890-2895.

Ariful Haque Siddique et al., Ultrasonic Manipulation of Magnetic Particles in a Microfluidic Channel, International Journal of Precision Engineering and Manufacturing, KSPE and Springer, 2014, vol. 15, No. 7, 1411-1416.

Taiwan Patent Office, "Office Action", dated Jul. 5, 2019, Taiwan.

* cited by examiner

MAGNETIC BIOSENSOR AND METHOD OF DETECTING BIOSIGNAL

BACKGROUND

1. Technical Field

The disclosure relates to a magnetic biosensor, and a method of detecting a biosignal.

2. Related Art

A biosensor device is a device that combines biological elements and physicochemical detection elements to detect an analyte. Nowadays, for most of the magnetic biosensing methods, the biomolecules to be tested are non-selectively spread on the biosensor, and the magnetic beads and the biomolecules specifically bond with each other. Then, the magnetic sensor induces the magnetic beads to achieve biomolecule detection.

In recent years, trace biomolecule detection has become a mainstream research in the field of biomedicine. Magnetic biosensing technology has the advantages of low power consumption, small size, light weight, low cost, etc. Therefore, the research on the trace biomolecule detection is gradually popular.

However, the biomolecules and the magnetic beads are non-selectively spread on the biosensor. The positions of the magnetic beads may generate an induced stray field in different directions for the biosensor. For example, when one magnetic bead is located above the biosensor and another magnetic bead is placed around the biosensor, the induced stray field of the magnetic beads will be opposite in direction due to the different magnetic beads spreading at different locations, which will offset each other, thereby reducing the total induced stray field. As a result, the change in the resistance to the biosensor is reduced, resulting in a very weak sensing signal obtained by the bio-sensing device, which is not suitable for detecting trace biomolecules.

SUMMARY

An embodiment of the disclosure provides a magnetic biosensor including a fluidic channel, a magnetic sensor, and an acoustic wave emitter. The magnetic sensor is disposed in correspondence to the fluidic channel. The acoustic wave emitter includes two wave generating units and the fluidic channel is disposed between the two wave generating units.

An embodiment of the disclosure provides a magnetic biosensor including a magnetic sensor, and an acoustic wave emitter. The acoustic wave emitter is configured to generate an ultrasonic standing wave, and the magnetic sensor corresponds to a node position of the ultrasonic standing wave.

An embodiment of the disclosure provides a method of detecting a biosignal. The method includes providing a plurality of biomolecules in a fluidic channel; generating an ultrasonic standing wave, and driving the plurality of biomolecules to a node position of the ultrasonic standing wave, wherein the node position of the ultrasonic standing wave corresponds to a magnetic sensor; providing a plurality of magnetic components in the fluidic channel, and bonding the plurality of biomolecules to the plurality of magnetic components; and sensing the plurality of magnetic components through the magnetic sensor, to obtain a magnetic induction signal.

Several exemplary embodiments accompanied with figures are described in detail below to further describe the disclosure in details.

DETAILED DESCRIPTION OF DISCLOSED EMBODIMENTS

Below, exemplary embodiments will be described in detail with reference to accompanying drawings so as to be easily realized by a person having ordinary knowledge in the art. The inventive concept may be embodied in various forms without being limited to the exemplary embodiments set forth herein. Descriptions of well-known parts are omitted for clarity, and like reference numerals refer to like elements throughout.

Figure 1:
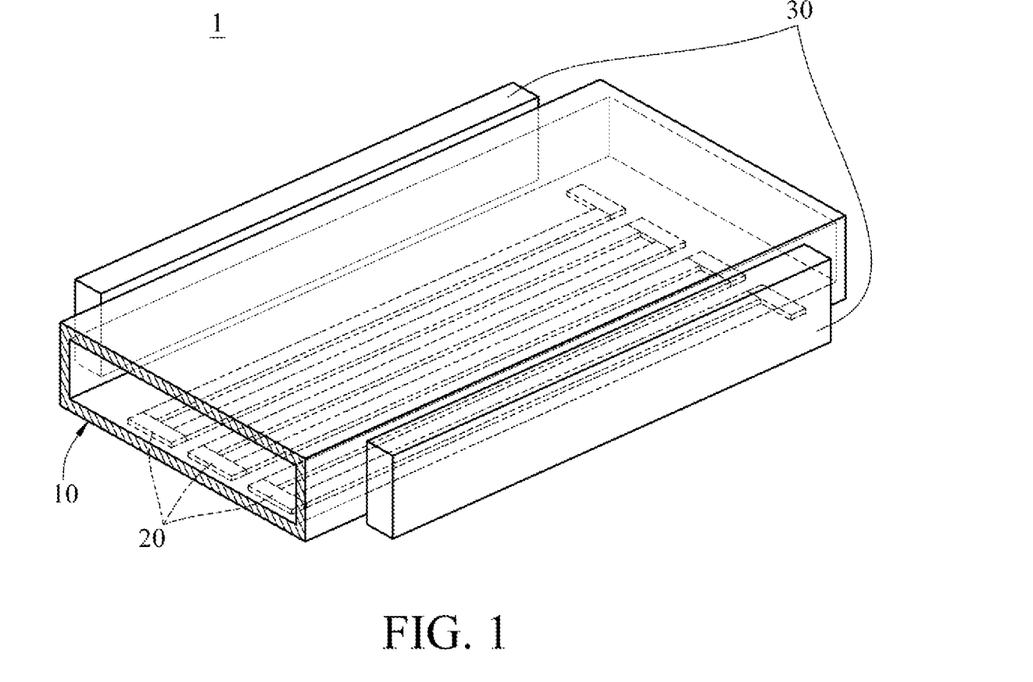
FIG. 1 is a stereoscopic diagram of a magnetic biosensor according to an embodiment of the disclosure.
Figure 2:
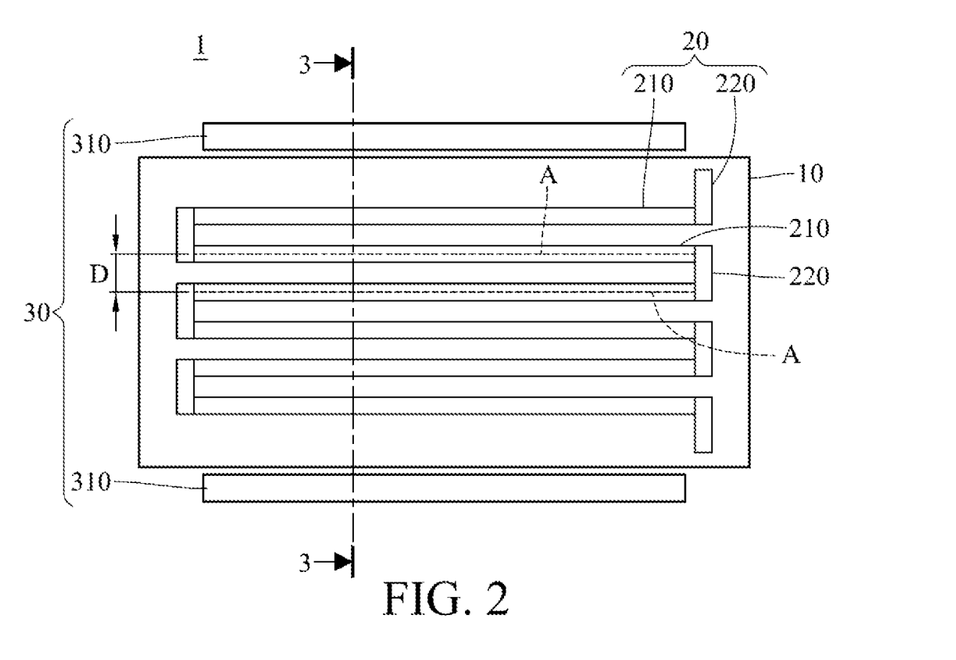
FIG. 2 is a top view of the magnetic biosensor of FIG. 1.
Figure 3:
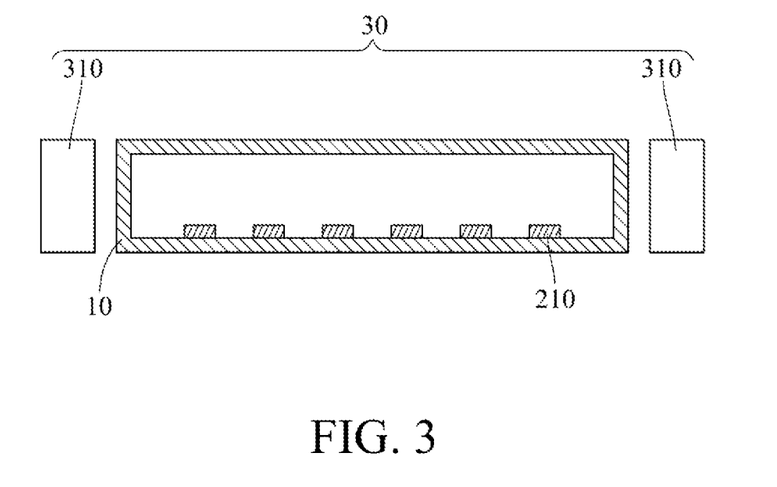
FIG. 3 is a cross-sectional view of the magnetic biosensor taken along a cross-sectional line 3-3 of FIG. 2.

According to an embodiment of the disclosure, the magnetic biosensor includes a fluidic channel, a magnetic sensor, and an acoustic wave emitter; wherein the magnetic sensor is disposed on the fluidic channel, and the fluidic channel is disposed between two wave generating units of the acoustic wave emitter. Referring to FIG. 1 to FIG. 3. FIG. 1 is a stereoscopic diagram of a magnetic biosensor according to an embodiment of the disclosure. FIG. 2 is a top view of the magnetic biosensor of FIG. 1. FIG. 3 is a cross-sectional view of the magnetic biosensor taken along a line 3-3 of FIG. 2. In the embodiment, the magnetic biosensor 1 includes a fluidic channel 10, a magnetic sensor 20, and an acoustic wave emitter 30. The fluidic channel 10 is, but not limited to, a glass substrate having micro-grooves. The magnetic sensor 20 is disposed on the fluidic channel 10 and has a multi-layer structure. The multi-layer structure covers a capping layer, a free layer, a barrier layer, a pinned layer, a seed layer, and a dielectric material layer. The dielectric material layer is used as a substrate for carrying chemical biomolecules. The acoustic wave emitter 30 is, but not limited to, an ultrasonic standing wave generator. The acoustic wave emitter 30 includes two wave generating units 310, and the fluidic channel 10 is disposed between the two wave generating units 310. The two wave generating unit 310 may be configured to generate an ultrasonic waves traveling in opposite directions to form ultrasonic standing waves passing through the fluidic channel 10.

According to an embodiment of the disclosure, the two wave generating units of the acoustic wave emitter consist of two acoustic wave transmitting units, or consist of one acoustic wave transmitting unit and one acoustic wave reflecting unit. Referring to FIG. 2, the two wave generating units 310 are two acoustic wave transmitting units, respectively, and both of them can generate ultrasonic waves to form standing waves. In other embodiments, one of the wave generating units is an acoustic wave transmitting unit, and the other of the wave generating units is an acoustic wave reflecting unit. The acoustic wave reflecting unit may be a mirror reflector, and the mirror reflector may reflect an ultrasonic wave generated from the acoustic wave transmitting unit to form standing waves.

According to an embodiment of the disclosure, the magnetic sensor includes a plurality of magnetic sensing units and a plurality of electrical connecting units. The plurality of magnetic sensing units are arranged in parallel and connected through the plurality of electrical connecting units. Referring to FIG. 2, the magnetic sensor 20 includes a plurality of magnetic sensing units 210 and a plurality of electrical connecting units 220. The magnetic sensing units 210 may be, but not limited to magnetoresistive sensors. The plurality of magnetic sensing units 210 are arranged in parallel and disposed on the fluidic channel 10. Each of the electrical connecting units 220 is connected to two of adjacent magnetic sensing units 210, and makes the magnetic sensing units 210 connect in series. A direct current (DC) voltage can be applied to the plurality of magnetic sensing units 210, and the change of magnet resistance of the magnetic sensor 20 may be observed when an external magnetic field sweeps.

In FIG. 2, the magnetic sensing units 210 are disposed on the outer wall of the fluidic channel 10, but are not limited thereto. In other embodiments, the magnetic sensing units 210 are disposed on the inner wall of the fluidic channel 10, or embedded inside the fluidic channel 10.

According to an embodiment of the disclosure, each of the two adjacent magnetic sensing units has a same space. Referring to FIG. 2, the two adjacent magnetic sensing units 210 has a same space D. The D is a distance from a central line A of one of the two magnetic sensing units 210 to the central line A of the other magnetic sensing unit.

Figure 4:
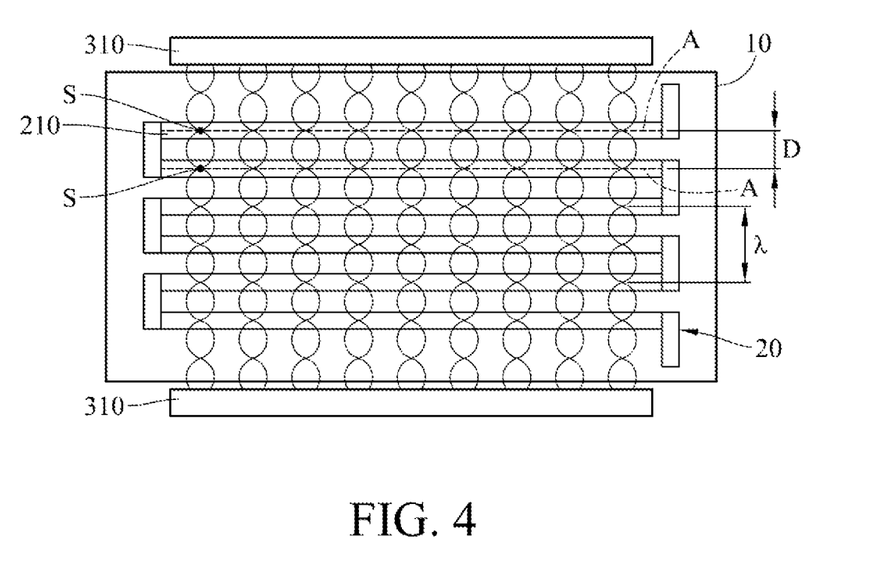
FIG. 4 is a top view of an ultrasonic standing wave of the magnetic biosensor of FIG. 2 according to an embodiment of the disclosure.

According to an embodiment of the disclosure, the plurality of magnetic sensing units correspond to different node positions of the ultrasonic standing wave respectively. FIG. 4 is a top view of generating an ultrasonic standing wave of the magnetic biosensor of FIG. 2 according to an embodiment of the disclosure. The ultrasonic standing wave passing through the fluidic channel 10 has a plurality of node positions. The central line A of each of magnetic sensing units 210 corresponds to each of the plurality of node positions S of the ultrasonic standing wave, respectively. That is, the central line A of each magnetic sensing unit 210 is respectively below each node position S.

According to an embodiment of the disclosure, the space between two adjacent magnetic sensing units is equal to a half of a wavelength of the ultrasonic standing wave. Referring to FIG. 4, an ultrasonic standing wave generated by acoustic wave emitter 30 has a wavelength λ. The central line A of each of the magnetic sensing units 210 corresponds to each node position S of the ultrasonic standing wave, respectively. That is, the configuration of the plurality of magnetic sensing units 210 satisfies the equation of $D=\lambda/2$.

A method of detecting a biosignal according to the embodiment of the disclosure will be described. FIG. 5 to FIG. 8 are schematic diagrams illustrating sensing biomolecules of the magnetic biosensor of FIG. 1.

Figure 5:
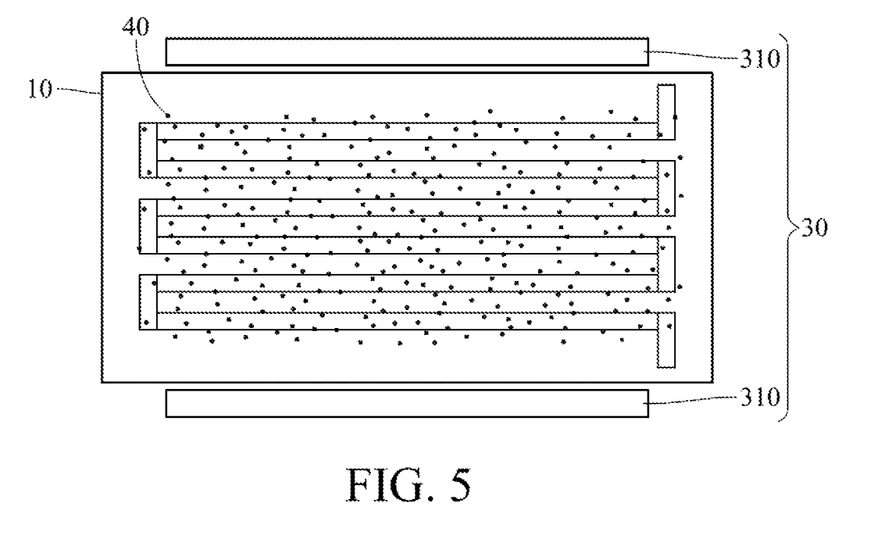
FIG. 5 to FIG. 8 are schematic diagrams illustrating sensing biomolecules of the magnetic biosensor of FIG. 1.

Firstly, a plurality of biomolecules are provided in the fluidic channel 10 of the magnetic biosensor 1. The plurality of biomolecules are, but not limited to, avian influenza biomarker molecule IL-6, cardiovascular disease biomarker molecule S100, C reactive protein (CRP), tuberculosis marker molecule IFNγ (Interferon γ), etc. They are mixed with a fluid (such as a biological buffer fluid) and enter the fluidic channel 10 from the injection port of the fluidic channel 10.

Figure 6:
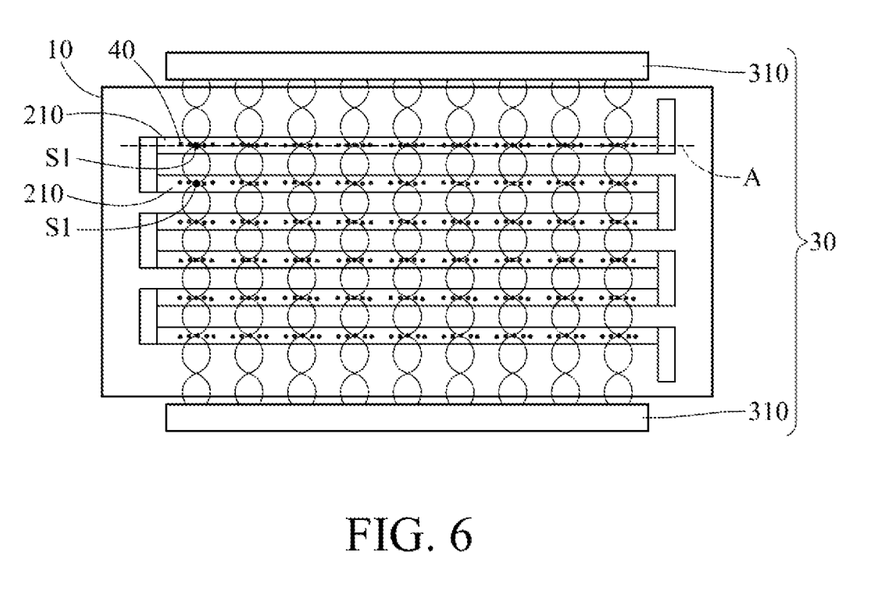

And then, the acoustic wave emitter 30 generates an ultrasonic standing wave and drives the plurality of biomolecules to a node position S of the ultrasonic standing wave. As shown in FIG. 6, the acoustic wave emitter 30 uses the acoustic radiation force and the acoustic streaming of the ultrasonic standing wave to drive the biomolecules 40 to the node position S, and then make the biomolecules 40 gather to a position which is above a magnetic sensing unit 210 of the magnetic sensor 20 corresponding to the node position S. The biomolecules 40 settle to the bottom of the fluidic channel 10, and react with the biological probe (for example, a Deoxyribonucleic acid (DNA) probe, not shown) above the magnetic sensing units 210 to bond with each other. The biomolecules 40 are then firmly positioned above the magnetic sensing units 210, and most of the biomolecules 40 are gathered in the center line A of the magnetic sensing units 210.

Figure 7:
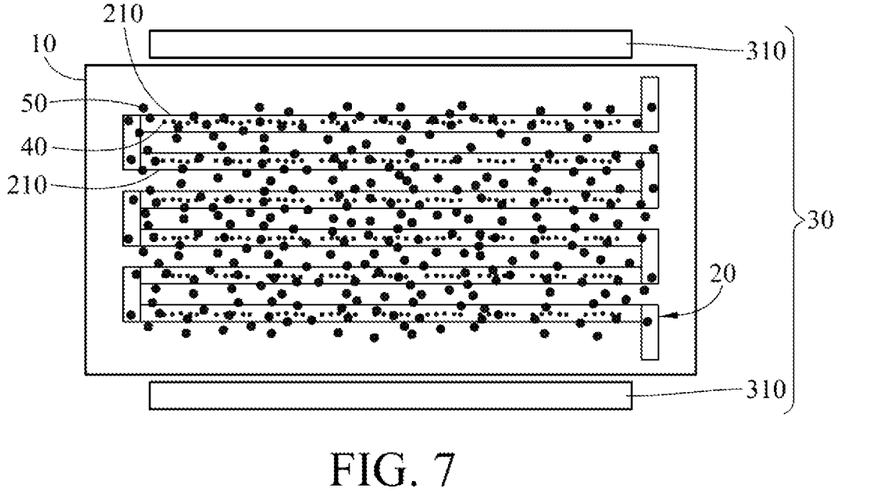

Next, a plurality of magnetic components 50 are provided in the fluidic channel 10, and at least a portion of the plurality of magnetic components connect the plurality of biomolecules specifically. As shown in FIG. 7, the plurality of magnetic components 50 are, but not limited to, magnetic beads with a micron or nanometer size. The plurality of magnetic components 50 enter the fluidic channel 10 from an injection port of the fluidic channel 10 and settle to the surface of magnetic sensing units 210 to bond with the biomolecules 40.

According to an embodiment of the disclosure, the magnetic components that are not bonded to the biomolecules will be removed. As show in FIG. 7, no biomolecules 40 is gathered underneath some of the magnetic components 50, and then these magnetic components 50 are not fixed on the magnetic sensing units 210. That is to say, these magnetic components 50 fail to be used to judge the amount of biomolecules 40, so it is necessary to remove these magnetic components 50 that are not bonded to the biomolecules 40. A buffer solution (for example, phosphate buffered saline, PBS) may be injected into the fluidic channel 10 to carry away these magnetic components 50 that are not bonded.

Figure 8:
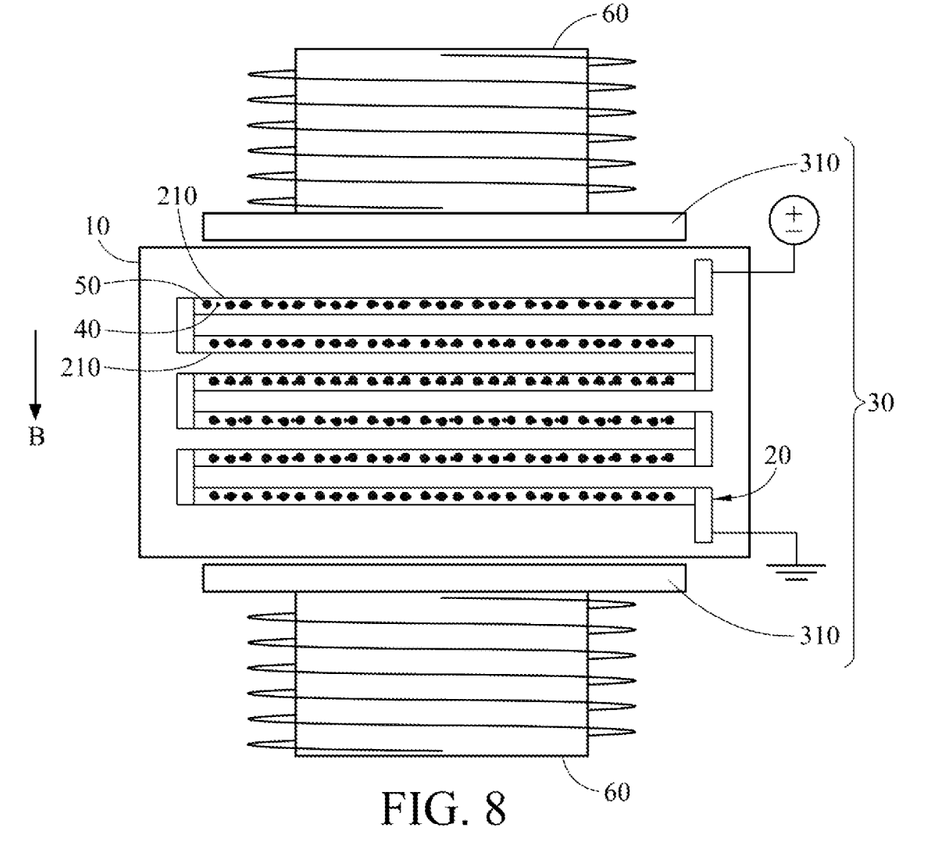

Next, the magnetic sensor senses the portion of the plurality of magnetic components to obtain a magnetic induction signal. As shown in FIG. 8, a voltage is applied from an external power source (not shown) to the magnetic sensor 20, and while an external magnetic field is applied from a magnetic field generator 60 to magnetize the magnetic components 50 for detection. Within the magnetic sensing units 210, the magnetic components 50 are affected by the external magnetic field to generate a stray field opposite to the direction B of the external magnetic field. The stray field may change a magnet resistance of the magnetic sensor 20, so that, the magnetic induction signal related to the biomolecules can be obtained according to the change of the magnet resistance. The magnetic induction signal may be related to the type or concentration of the biomolecules 40. In FIG. 8, the magnetic field direction B generated by the magnetic field generator 60 is parallel to the wave transmission direction of the ultrasonic standing wave, that is, the magnetic field generator 60 provides a horizontal magnetic field direction B, but the magnetic field direction B is not limited thereto. In other embodiments, the magnetic field direction generated by the magnetic field generator may be parallel to the normal direction of the magnetic sensor, that is, the magnetic field direction may be perpendicular to the magnetic sensor.

Figure 9:
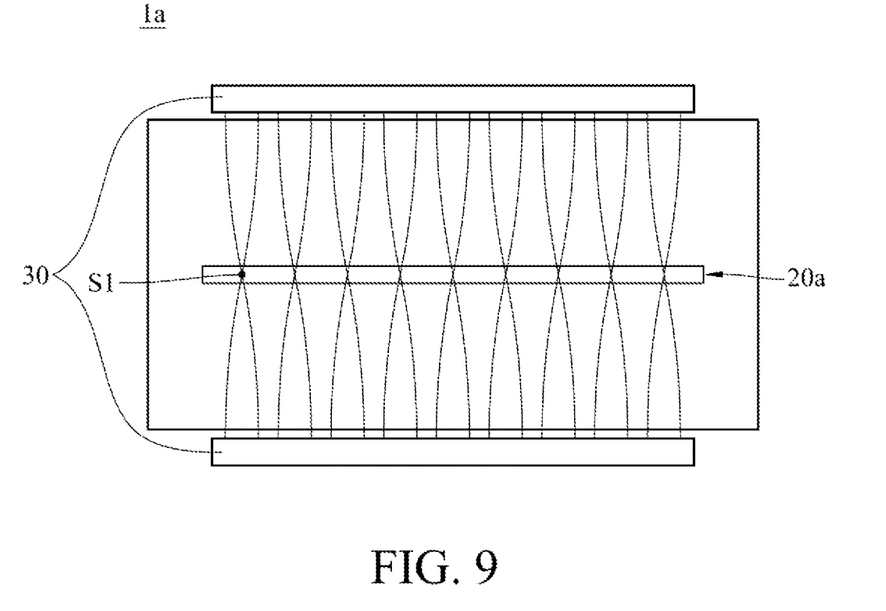
FIG. 9 is a top view of a magnetic biosensor according to a second embodiment of the disclosure.

According to an embodiment of the disclosure, the magnetic sensor corresponds to a node position of the ultrasonic standing wave. FIG. 9 is a top view of a magnetic biosensor according to a second embodiment of the disclosure. The second embodiment is similar to the first embodiment. Therefore, the following describes the difference between the two embodiments. In the second embodiment, the magnetic sensor 20a of the magnetic biosensor 1a is a single magnetoresistive sensor, and the center of the magnetic sensor 20a corresponds to the node position S of the ultrasonic standing wave generated by the acoustic wave emitter 30, that is, the node position S is located above the magnetic sensor 20a.

Figure 10:
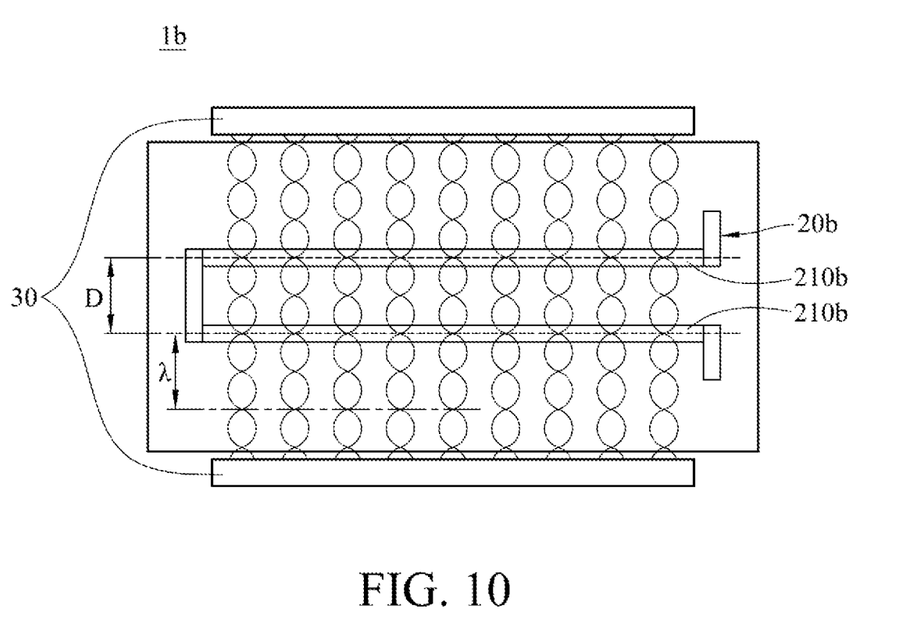
FIG. 10 is a top view of a magnetic biosensor according to a third embodiment of the disclosure.

According to an embodiment of the disclosure, a space between two adjacent magnetic sensing units is equal to an integral multiple of a half of a wavelength of the ultrasonic standing wave. Referring to FIG. 10, FIG. 10 is a top view of a magnetic biosensor according to a third embodiment of the disclosure. The third embodiment is similar to the first embodiment. Therefore, the following describes the difference between the two embodiments. In the third embodiment, the magnetic sensor 20a of the magnetic biosensor 1b includes two magnetic sensing units 210b. The space D between the two magnetic sensing units 210b is equal to twice of a half of the wavelength λ of the ultrasonic standing wave. That is, the space D is equal to the wavelength λ of the ultrasonic standing wave. In other embodiments, the space D between the two magnetic sensing units 210b is more than triple of a half of the wavelength λ of the ultrasonic standing wave. That is, the configuration of the plurality of magnetic sensing units 210b satisfies the following equation of D=n λ/2, wherein n is a positive integer. In other words, a space between each of the two adjacent magnetic sensing units is equal to an integral multiple of a half of the wavelength of the ultrasonic standing wave.

Figure 11:
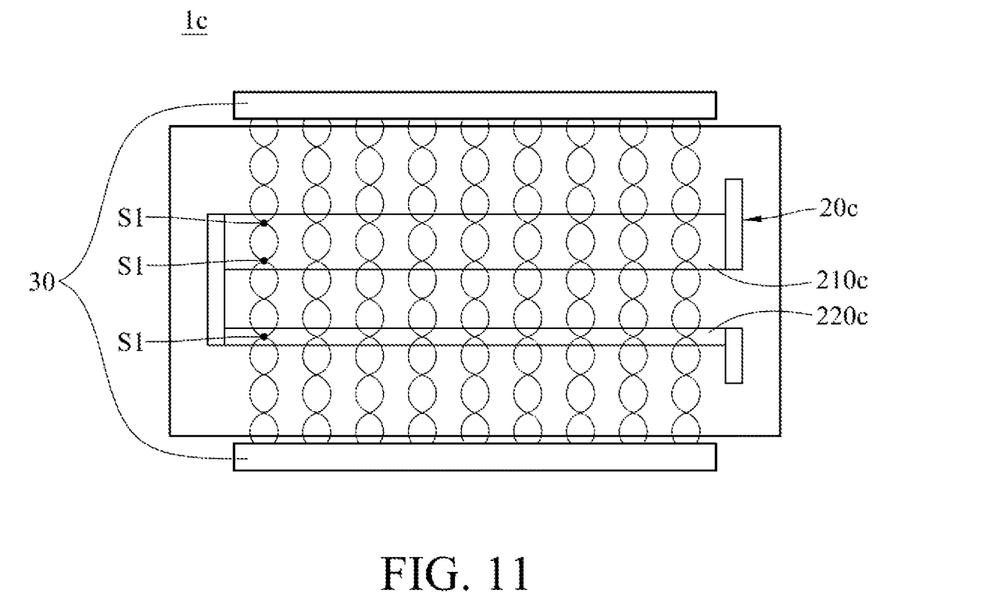
FIG. 11 is a top view of a magnetic biosensor according to a fourth embodiment of the disclosure.

FIG. 11 is a top view of a magnetic biosensor according to a fourth embodiment of the disclosure. The fourth embodiment is similar to the first embodiment. Therefore, the following describes the difference between the two embodiments. In the fourth embodiment, the magnetic sensor 20a of the magnetic biosensor 1c includes a first magnetic sensing unit 210c and a second magnetic sensing unit 220c, and the first magnetic sensing unit 210c and the second magnetic sensing unit 220c have different widths. In FIG. 11, the width of the first magnetic sensing unit 210c is greater than the width of the second magnetic sensing unit 220c. The first magnetic sensing unit 210c corresponds to two node positions S of the ultrasonic standing wave generated by the acoustic wave emitter 30. Thereby, two groups of biomolecules can be provided on the first magnetic sensing unit 210c to achieve a diverse detection.

Figure 12:
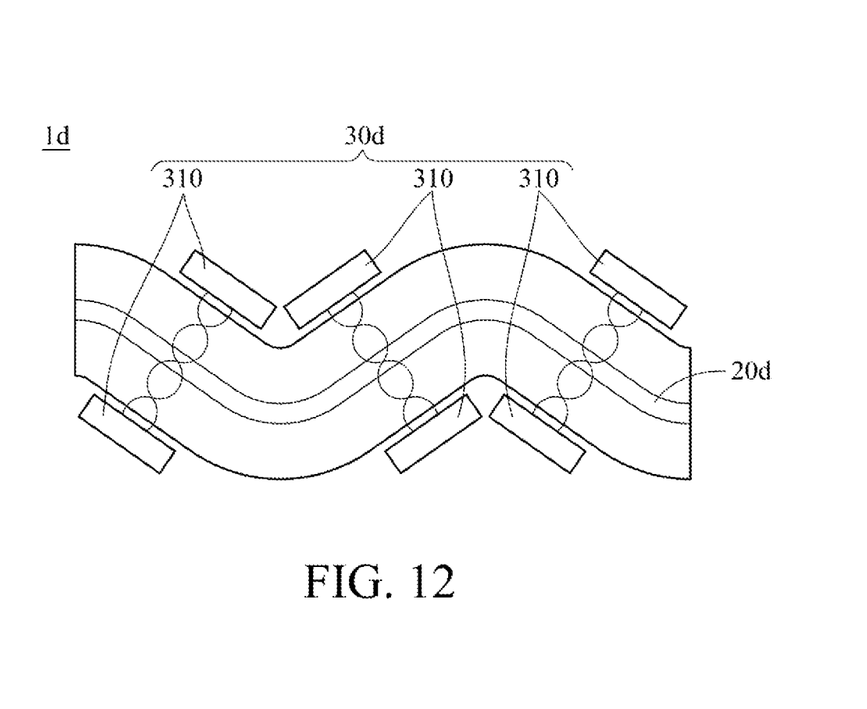
FIG. 12 is a top view of a magnetic biosensor according to a fifth embodiment of the disclosure.

FIG. 12 is a top view of a magnetic biosensor according to a fifth embodiment of the disclosure. The fifth embodiment is similar to the first embodiment. Therefore, the following describes the difference between the two embodiments. In the fifth embodiment, the magnetic biosensor 1d includes a magnetic sensor 20d and an acoustic wave emitter 30d. The acoustic wave emitter 30d includes a plurality of wave generating units 310. The magnetic sensor 20d is a curved and extended magnetic sensing unit. Any two of the plurality of wave generating units 310 of the acoustic wave emitter 30d may be a pair and respectively disposed on two opposite sides of the magnetic sensor 20d, and the plurality of wave generating units 310 are disposed along an extending direction of the curved magnetic sensor 20d. That is, the plurality of wave generating units 310 cooperate with the curved magnetic sensor 20d to have a non-linear arrangement. So that, the wave transmission direction of the ultrasonic standing wave is orthogonal to the extending direction of the curved magnetic sensor 20d.

Figure 13:
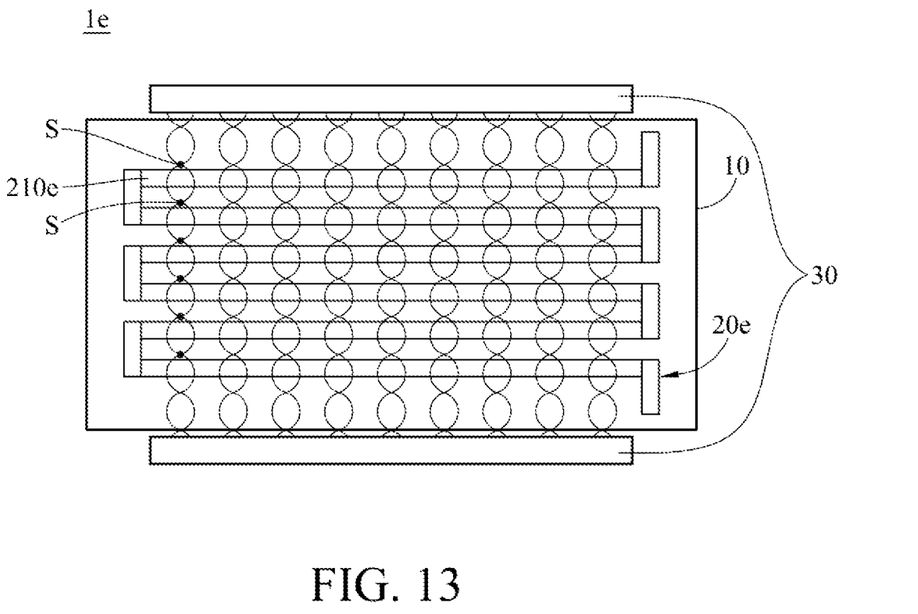
FIG. 13 is a top view of a magnetic biosensor according to a sixth embodiment of the disclosure.
Figure 14:
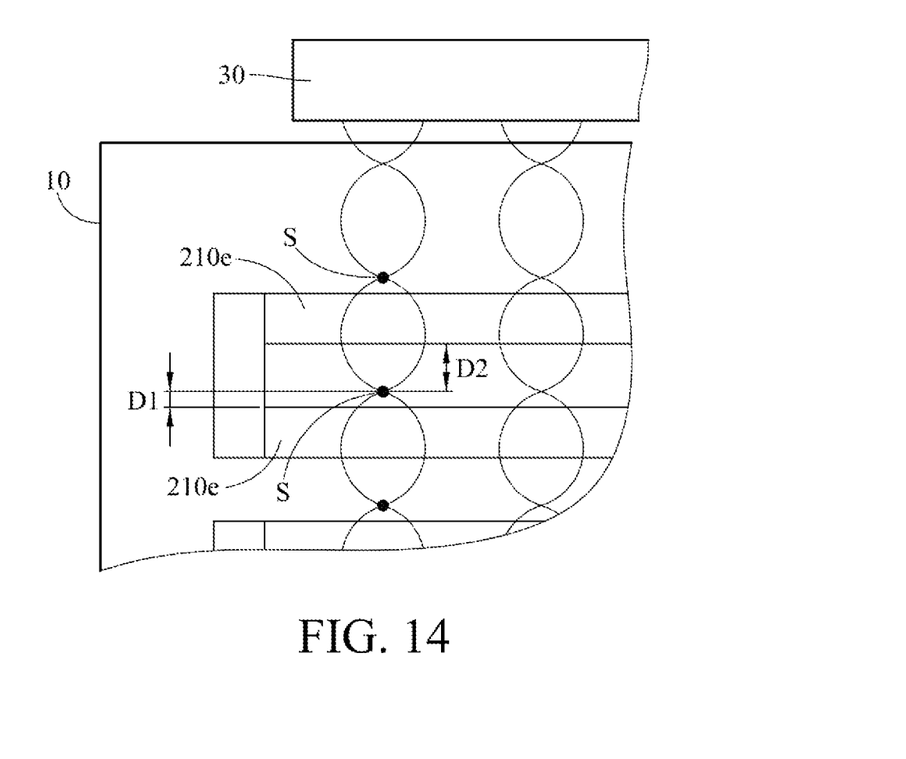
FIG. 14 is an enlarged cross-sectional view of the magnetic biosensor of FIG. 13.

FIG. 4 and FIG. 9 illustrate the node position of the ultrasonic standing wave is located above the magnetic sensing unit of the magnetic sensor, and the biomolecules may gather above the magnetic sensing units, but the node position of the ultrasonic standing wave is not limited thereto. Referring to FIG. 13 and FIG. 14, wherein FIG. 13 is a top view of a magnetic biosensor according to a sixth embodiment of the disclosure. FIG. 14 is an enlarged cross-sectional view of the magnetic biosensor of FIG. 13. The embodiment of FIG. 13 is similar to the first embodiment. Therefore, the following describes the difference between the embodiments of FIG. 13 and FIG. 1.

In the embodiment of FIG. 13, the magnetic biosensor 1e includes a magnetic sensor 20e and an acoustic wave emitter 30. The magnetic sensor 20e includes a plurality of magnetic sensing units 210e. The ultrasonic standing wave passing through the fluidic channel 10 includes a plurality of node positions S. These node positions S may be disposed near the plurality of magnetic sensing units 210e of the magnetic sensor 20e and correspond to the surrounding of plurality of magnetic sensing units 210e. Furthermore, for an adjacent group of node positions S and magnetic sensing units 210e, the preferred space D1 between the node position S and one of two magnetic sensing units 210e is from 0 to half the space between two adjacent magnetic sensing units. In the embodiment of FIG. 13, the plurality of node locations S are respectively near the plurality of magnetic sensing units 210e. However, the number of magnetic sensing units 210e is not limited thereto.

According to an embodiment of the disclosure, at least one node position is disposed between any two adjacent magnetic sensing units. In addition, two distances from the node position between two adjacent magnetic sensing units to each of the two adjacent magnetic sensing units are different. As shown in FIG. 14, for a set of adjacent magnetic sensing units 210e, there is a node position S between two adjacent magnetic sensing units 210e. There is a distance D1 between a node position S and one of the magnetic sensing units 210e, and there is a distance D2 between the same node position S and another magnetic sensing unit 210e, and the distance D1 is different from the distance D2. Thereby, when an external magnetic field in the perpendicular transparent direction or the horizontal direction is applied, the problem that the stray field affected from each other due to the magnetic components being too close can be prevented.

As shown in FIG. 13, at least one node position is disposed between two adjacent magnetic sensing units 210e, but the number of the node positions S between two adjacent magnetic sensing units 210e is not limited thereto. In addition, FIG. 14 illustrates that the distances D1 and D2 between the node position S and the two magnetic sensing units 210e are different, but the scope of the present disclosure is not limited thereto. In other embodiments, the distances D1 and D2 may be the same.

According to the embodiments, aforementioned in the magnetic biosensor and the method of detecting a biosignal, the two wave generating units of the acoustic wave emitter are respectively disposed on both sides of the fluidic channel. And the acoustic wave emitter may generate an ultrasonic standing waves to gather the biomolecules above the magnetic sensor or around the magnetic sensor. Therefore, when the magnetic components are connected to the biomolecules, the magnetic components can also be gathered above or around the magnetic sensor. Due to the magnetic components are gathered at a predetermined location, when the magnetic components generate a stray field, the strength of stray field does not cancel from each other. Therefore, when there are only a small part of biomolecules and magnetic components, the magnetic sensor can induce the stray field to obtain a sufficient intensity of the magnetic induction signal. Further, it is helpful for the magnetic biosensor to detect the trace biomolecules.

It will be apparent to those skilled in the art that various modifications and variations can be made to the disclosed embodiments. It is intended that the specification and examples be considered as exemplary only, with a true scope of the disclosure being indicated by the following claims and their equivalents.

The invention claimed is:

1. A magnetic biosensor, comprising:
a fluidic channel;
a magnetic sensor including a plurality of magnetic sensing units, disposed in correspondence to the fluidic channel; and
an acoustic wave emitter, including two wave generating units configured to generate an ultrasonic standing wave in the fluidic channel;
wherein the fluidic channel is disposed between the two wave generating units, the plurality of magnetic sensing units correspond to different node positions of the ultrasonic standing wave, respectively.

2. The magnetic biosensor of claim 1, wherein the magnetic sensor is disposed on the fluidic channel.

3. The magnetic biosensor of claim 1, wherein the magnetic sensor further includes a plurality of electrical connecting units, and the plurality of magnetic sensing units are arranged in parallel and connected through the plurality of electrical connecting units.

4. The magnetic biosensor of claim 1, wherein the plurality of magnetic sensing units are arranged in parallel and each of two adjacent magnetic sensing units of the plurality of magnetic sensing units has a same space.

5. The magnetic biosensor of claim 1, wherein each of the node positions is disposed above one of the plurality of magnetic sensing units.

6. The magnetic biosensor of claim 1, wherein each of the node positions is near one of the plurality of magnetic sensing units.

7. The magnetic biosensor of claim 1, wherein two distances from the node position between the two adjacent magnetic sensing units of the plurality of magnetic sensing units to each of the two adjacent magnetic sensing units are different.

8. The magnetic biosensor of claim 1, wherein a space between each of the two adjacent magnetic sensing units is equal to an integral multiple of a half of a wavelength of the ultrasonic standing wave.

9. The magnetic biosensor of claim 8, wherein the two wave generating units of the acoustic wave emitter consist of two acoustic wave transmitting units, or consist of one acoustic wave transmitting unit and one acoustic wave reflecting unit.

10. A magnetic biosensor, comprising:
a magnetic sensor including a plurality of magnetic sensing units; and
an acoustic wave emitter, configured to generate an ultrasonic standing wave, wherein the plurality of magnetic sensing units correspond to different node positions of the ultrasonic standing wave, respectively.

11. The magnetic biosensor of claim 10, wherein each of the node positions is disposed above one of the plurality of magnetic sensing units.

12. The magnetic biosensor of claim 10, wherein each of the node positions is disposed near one of the plurality of magnetic sensing units.

13. The magnetic biosensor of claim 10, wherein two distances from the node position between two adjacent magnetic sensing units of the plurality of magnetic sensing units to each of the two adjacent magnetic sensing units are different.

14. The magnetic biosensor of claim 13, wherein a space between each of the two adjacent magnetic sensing units is equal to an integral multiple of a half of a wavelength of the ultrasonic standing wave.

15. A method of detecting a biosignal, the method comprising:
providing a plurality of biomolecules in a fluidic channel,
generating an ultrasonic standing wave, and driving the plurality of biomolecules to different node positions of the ultrasonic standing wave, and the node positions of the ultrasonic standing wave correspond to a plurality of magnetic sensing units, respectively,
providing a plurality of magnetic components in the fluidic channel, and bonding a portion of the plurality of biomolecules to a portion of the plurality of magnetic components; and
sensing the portion of the plurality of magnetic components by the plurality of magnetic sensing units, to obtain a magnetic induction signal.

16. The method of claim 15, further comprising:
removing the magnetic components that are not bonded to the plurality of biomolecules.

17. The method of claim 15, wherein each of the node positions is above one of the plurality of magnetic sensing units.

18. The method of claim 15, wherein each of the node positions is near one of the plurality of magnetic sensing units.

19. The method of claim 15, wherein a space between each of the two adjacent magnetic sensing units of the plurality of magnetic sensing units is equal to an integral multiple of a half of a wavelength of the ultrasonic standing wave.

20. The method of claim 15, further comprising:
applying an external magnetic field to magnetize the plurality of magnetic components, and sensing the plurality of magnetic components by the magnetic sensor.

* * * * *